United States Patent [19]

Kamieniecki

[11] Patent Number: 4,663,526
[45] Date of Patent: May 5, 1987

[54] NONDESTRUCTIVE READOUT OF A LATENT ELECTROSTATIC IMAGE FORMED ON AN INSULATING MATERIAL

[76] Inventor: Emil Kamieniecki, 30 Carville Ave., Lexington, Mass. 02173

[21] Appl. No.: 719,725

[22] Filed: Apr. 3, 1985

Related U.S. Application Data

[63] Continuation-in-part of Ser. No. 686,420, Dec. 26, 1984.

[51] Int. Cl.$^4$ .......................... G01T 1/24; H01L 31/00
[52] U.S. Cl. ............................... 250/315.3; 250/327.2; 250/370
[58] Field of Search ............ 250/492.2 R, 271, 315.3, 250/327.2, 370 R, 484.1, 370 GX; 378/28; 365/112, 215; 357/30 US

[56] References Cited

U.S. PATENT DOCUMENTS

| | | | |
|---|---|---|---|
| 3,199,086 | 8/1965 | Kallmann et al. ................ | 430/19 |
| 3,691,376 | 9/1972 | Bauerlein et al. ................ | 250/492.2 |
| 3,859,527 | 1/1975 | Luckey ............................... | 250/327.2 |
| 4,176,275 | 11/1979 | Korn et al. ....................... | 250/213 R |
| 4,296,478 | 10/1981 | Kiess et al. ...................... | 365/112 |
| 4,319,284 | 3/1982 | Kiess et al. ...................... | 358/294 |
| 4,404,422 | 9/1983 | Green et al. ..................... | 136/255 |
| 4,508,966 | 4/1985 | Oberschmid et al. ........... | 250/327.2 |

FOREIGN PATENT DOCUMENTS 199351 11/1983 Japan ................................. 250/271

Primary Examiner—Janice A. Howell
Assistant Examiner—Constantine Hannaher
Attorney, Agent, or Firm—Irving M. Kriegsman

[57] ABSTRACT

A method and apparatus are described for the nondestructive readout of a latent electrostatic image formed on a sheet or layer of insulating material. A sheet or layer of semiconductor material is disposed in relatively close proximity to the insulating material. The latent electrostatic image formed on the insulating material causes a surface depletion layer to by produced by induction at the surface of the semiconductor material. The location and distribution of the accumulated charges on the semiconductor material are read out as analog electrical signals corresponding to the ac surface photovoltage induced on the semiconductor material as the semiconductor material is scanned with a low intensity modulated light beam of appropriate wavelength, the magnitude of the analog signals depending on the local charge density. The analog electrical signals so obtained are then digitized, processed and stored and-/or displayed.

42 Claims, 16 Drawing Figures

NONDESTRUCTIVE READOUT OF A LATENT ELECTROSTATIC IMAGE FORMED ON AN INSULATING MATERIAL

CROSS-REFERENCE TO RELATED APPLICATIONS

This application is a continuation-in-part of U.S. patent application Ser. No. 686,420 filed in the name of Emil Kamieniecki on Dec. 26, 1984.

BACKGROUND OF THE INVENTION

The present invention relates generally to an apparatus and method for the nondestructive readout of a latent electrostatic image formed on an insulating material. More particularly, the present invention is concerned with a method and apparatus for reading out the location and magnitude of accumulated charges (surface density of electrostatic charges) on a sheet or layer of insulating material which involves producing a surface depletion layer related to the accumulated charges on a sheet or layer of semiconducting material by induction and then determining the location and magnitude of the accumulated charges on the semiconductor material using the surface photovoltage effect.

The invention is especially useful in reading out a latent electrostatic image formed on an insulator by irradiation with X-rays but is not exclusively limited to electrostatic images formed by that type of radiation.

In a number of situations, such as in tire manufacturing, weaving, printing, handling liquid fuels or electronic devices, accumulated electrostatic charges are unwanted and undesirable. In other instances, such as for example in electrophotography, accumulation of electrostatic charges (i.e. static electricity), is beneficial and is used to form a latent electrostatic image of an object which is then developed. In both cases, however, it is often necessary to be able to accurately determine the location and magnitude of the electrostatic charges.

There are a variety of known methods for measuring electrostatic charge. Early techniques for sensing static electricity made use, for instance, of the gold leaf electroscope, the pith ball, and very light material such as cigarette ash. These methods have only historical value. Presently, electrostatic charge is usually determined from measurements of the electrostatic potential on a surface. This can be done, for instance, by using an electrometer (high input impedance voltmeter) to measure the ac signal induced on a reference electrode. The ac signal may be generated in this method by periodically introducing an electrical shield into the space between the reference electrode and the surface under measurement. The electrometric method is nondestructive and allows for measurement of a magnitude of electrostatic charge. However, the determination of the distribution of charge requires slow and cumbersome mechanical scanning of the studied surface with a small aperture reference electrode or the use of an array of electrodes.

There exist a number of destructive methods for determining charge distribution. Classical examples are the vidicon tube and electrophotography. In a vidicon tube, a charge distribution pattern is stored in a semiconductor target. The distribution of charge is determined by measuring the variation of electron beam current when the target is scanned by an electron beam. In electrophotography, the charge distribution on a xerographic plate (i.e. the latent electrostatic image formed on the xerographic plate) is determined from the distribution of toner particles which are attracted to the xerographic plate by the charges during the development process.

The prior art of nondestructive measurement of charge accumulated in an insulating layer using semiconductors lies largely in the area of electronic devices, especially computer memories. In this case determination of charge stored in a single element is accomplished by measuring variations of current in the conductive channel formed under the surface of the semiconductor.

The subject of ac surface photovoltage is described in a paper by E. O. Johnson of RCA Laboratories, entitled, "Large-Signal Surface Photovoltage Studies with Germanium", Physical Review, Vol. 111, No. 1, pp. 153-166, 1958. The paper discusses the relation between surface photovoltage and surface potential and hence space charge in the semiconductor.

The photovoltaic response of the semiconductor InSb has been used for determination of the charge distribution induced in the semiconductor by an electromagnetic radiation. This is described by R. J. Phelen, Jr., and J. O. Dimmock, in an article entitled, "Imaging and Storage with a Uniform MOS Structure", Applied Physics Letters, Vo. 22, No. 11, pp. 359-361, 1967. The image projected on a uniform MOS structure (a semitransparent metal film-oxide layer-InSb sandwich) modified the surface depletion region in the semiconductor. The charge stored in the depletion layer was determined by measuring the photovoltaic response resulting from saturation of this layer by a "reading" photon beam. The few micron thick depletion layer is the only active structure.

More recently, it has been shown that the ac surface photovoltage induced by a low intensity beam of light, modulated at high frequency, and having photon energy comparable to or exceeding the band gap of the semiconductor, is proportional to the reciprocal of the semiconductor depletion layer capacitance and hence is proportional to the density of charge in this layer. Furthermore, it has been found that under proper conditions the measured signal is only weakly dependent on the distance between semiconductor and the reference electrode. This is discussed by E. Kamieniecki in a paper entitled, "Determination of Surface Space Charge Capacitance Using Light Probe", Journal of Vacuum Science & Technology, Vol. 20, No. 3, pp. 811-814, 1982; and a paper entitled "Surface Measured Capacitance: Application to Semiconductor/Electrolyte System", Journal of Applied Physics, Vol. 54, No. 11, pp. 6481-6487, 1983.

The general conclusion of studies made to date is the existance of a correlation between the local magnitude of charge in the depletion layer at the semiconductor surface and the ac surface photovoltage. The ac surface photovoltage is defined herein as the variations of the surface potential induced by a photon beam which is intensity modulated, either periodically or not periodically. This photon beam may cause the generation of carriers at the front surface in the depletion region, or, when illuminated from the back (opposite side) in the bulk and diffusion (migration) of the carriers toward the depletion region.

In U.S. Pat. No. 3,859,527 to G. W. Luckey there is disclosed an apparatus and method for recording images on recording mediums which images correspond to high energy radiation patterns. A temporary storage medium, such as an infrared-stimulable phosphor or thermoluminescent material, is exposed to an incident pattern of high energy radiation. A time interval after exposure a small area beam of long wavelength radiation or heat scans the screen to release the stored energy as light. An appropriate sensor receives the light emitted by the screen and produces electrical energy in accordance with the light received. The information carried by the electrical energy is transformed into a recorded image by scanning an information storage medium with a light beam which is intensity modulated in accordance with the electrical energy.

Articles of interest concerning gas ionography, sometimes referred to as electron radiology, wherein X-ray photons are absorbed in a high-pressure gas between the parallel plates of an ion chamber and the ions produced are collected on an insulating foil covering one of the plates include "Efficiency and Resolution of Ionography in Diagnostic Radiology" by A. Fenster, D. Plewes and H. E. Johns in Medical Physics, Vol. 1, No. 1, 1974, pages 1–10; "Gas Ionization Methods of Electrostatic Image Formation in Radiography" by H. E. Hohns etc., British Journal of Radiology, September, 1974, pages 519–529; "Charging Characteristics of Ionographic Latent Images", B. G. Fallone and E. B. Podgorsak, Medical Physics, 11(2), March/April, 1984, pages 137–144; "Liquid Ionography For Diagnostic Radiology", A. Fenster and H. E. Johns, Medical Physics, Vol. 5, No. 5, September/October, 1974, pages 262–265; and Theoretical and Experimental Determination of Sensitivity and Edge Enhancement in Xeroradiography and Ionography" D. Plewes and H. E. Johns, Medical Physics 7(4), July/August, 1980, pages 315–323.

SUMMARY OF THE INVENTION

A method of reading out a latent electrostatic image formed on or at the surface of a sheet or layer of insulating material according to this invention comprises providing a sheet or layer of semiconducting material in relatively close proximity to the insulating material so as to produce by induction a surface depletion layer at the surface of a sheet or layer of semiconducting material and then measuring the ac surface photovoltage on the semiconducting material which is produced when the semiconducting material is scanned with an intensity modulated beam of light of appropriate wavelength.

An apparatus for reading out accumulated charges in a sheet or layer of insulating material according to an embodiment of this invention includes a sheet or layer of semmiconducting material, a reference electrode, a light source, focussing optics, a scanner and amplifying electronics.

It is an object of this invention to provide a new and improved method and apparatus for reading out a latent electrostatic image formed on a sheet or layer of insulating material.

It is another object of this invention to provide a method as described above which is nondestructive.

It is a further object of this invention to provide a method and apparatus as described above wherein the latent electrostatic image is read out as analog electrical signals.

It is still a further object of this invention to provide a new and improved readout device.

It is yet still another object of this invention to provide a new and improved photoreceptor.

It is another object of this invention to provide a reusable solid state photoreceptor which is capable of storing a latent X-ray image.

Various objects and advantages will appear from the description to follow. In the description, reference is made to the accompanying drawing which forms a part thereof, and in which is shown by way of illustration, an embodiment will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF PREFERRED EMBODIMENTS

Figure 1:
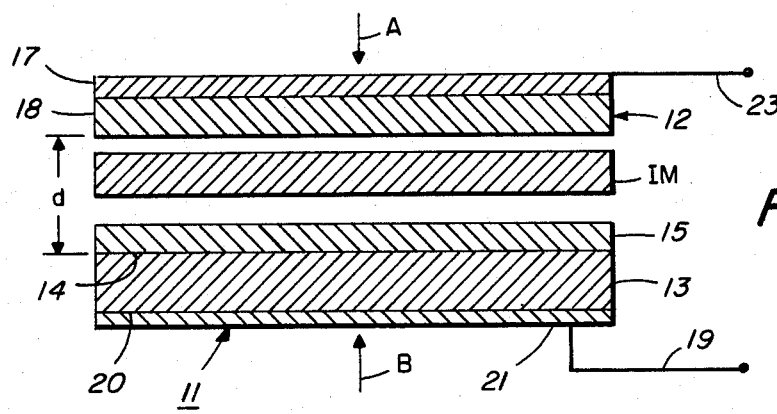
FIG. 1 is cross-sectional view of an insulator on which a latent electrostatic image may be formed and a readout device and reference electrode constructed according to one embodiment of this invention for use in reading out the latent electrostatic image formed on the insulator.

The present invention is directed to (I) an apparatus for reading out the location and magnitude (or more exactly surface distribution) of the charges accumulated in a sheet or layer of insulating material and (II) a method of reading out a charge distribution pattern in a sheet or layer of an insulating material.

The main parts of the apparatus are (1) a readout device, (2) a reference electrode, (3) an illumination system, (4) a scanner and (5) an electronic detection system.

The readout device includes a sheet or layer of semiconductor material. The illumination system includes a light source, focusing optics and a light modulator.

The readout device may be attached to or be separated from the insulating material.

The semiconductor material which may be in the form of either a sheet (wafer) or a layer (film) is provided with an electrical contact on its back or side surface. The front surface of the semiconductor may be left uncovered or, for electrical protection, may be covered with a protective insulating layer. Examples of the semiconducting materials which may be used are crystalline, polycrystalline or amorphous silicon or alloys of silicon. The protective insulating layer may be, for example, silicon oxide or silicon nitride. Positioned some distance from and in front of the front side of the semiconductor is the conductive reference electrode. The semiconductor may be illuminated (i.e. scanned) with light from the illumination system from either the front side through the reference electrode or from the back side. In the case of illumination from the front side, both the reference electrode and the protective insulating material must be transparent for the light being used, and in the case of illumination from the back side, the back electrical contact and any support or substrate for the semiconductor must be transparent to the light being used. In the case of front illumination, the light of photon energy exceeding the band gap of semiconductor is preferred for reason of high efficiency. In case of illumination from the back, the photon energy should be comparable to the energy gap, so that it will penetrate the semiconductor close enough to the front surface to provide carriers in the depletion layer.

In one embodiment of the invention hereinafter described, the insulating material (insulator) carrying the charge distribution which is to be sensed is much thinner than the gap between the semiconductor and reference electrode and in another embodiment, the thickness of the insulating material is comparable to the gap.

In the first embodiment noted above, the body of insulating material whose accumulated charge pattern is to be measured is placed so that its distance from the semiconductor is much smaller than the distance from the reference electrode. For certain applications such as determination of the density pattern of the charge placed on the surface of the insulator and migration of this charge across the insulator (e.g. under illumination in the case of the photoconductive insulators such as alloys containing selenium) this insulating material may even be attached to the front surface of the semiconductor for instance by deposition over the protective, insulating layer. The effect of charge migration across the insulator can be determined by measuring the total charge accumulated in the insulator after removing charge which remained on the surface of the insulator opposite to the semiconductor. Such charge might be removed using a brush or an ac corona as practiced in xerography.

The invention may also be used to measure the charge deposited directly on a layer of insulating material (e.g. protective insulator) formed by any means, such as deposition, on the semiconductor. The deposition of charges may be produced by irradiation with X-rays of a gas, such as air, xenon or freon.

In the second embodiment noted above, the semiconductor is placed close to one side of the layer or plate of insulating material and the reference conductive electrode is located close to the opposite side of layer or plate of insulating material. If the charge is formed on one side of this insulating layer and then, as in the xerographic process, migrates in certain locations to the opposite surface, the charge located on the surface of the insulator that is close to the conductive reference electrode will be neutralized by the charge in the reference electrode and only the charge located at the surface neighboring the semiconductor will induce opposite charge in the semiconductor. In this case, the method of this invention will allow for determination of charge density pattern at one surface only, namely that surface located close to the semiconductor, and hence will allow for determination of the effect of charge migration in the insulator.

In the case of front illumination, the insulator under measurement should be transparent (or semitransparent) for the light used and the light used must not cause any charge redistribution in this insulator. This is not required in the case of back illumination providing that this illumination does not penetrate into the insulator under measurement.

Sensing of the electrostatic charge accummulated in the insulating material according to the method of this invention requires the presence of a depletion layer in the semiconductor. This can be realized by using a protective insulating layer that is either precharged (by external means) or with an appropriate charge built into it. The charge accumulated in the insulator under measurement will only modify the pre-established depletion layer. The presence of a depletion layer may also be achieved by the use of the semiconductor of the appropriate type of conductivity allowing for formation of the depletion layer due to induced charge. In this case, an n-type semiconductor should be used for sensing negative charge and p-type for sensing positive charge. In any case, the charge build-up in the semiconductor surface (interface) states should be low enough to allow for modification of the depletion layer due to charge induced in the semiconductor.

The output electrical signal produced in reading out the accumulated charges on the semiconductor is generated by the intensity modulated illumination in the charge sensitive part of the readout apparatus i.e. between the semiconductor and the reference electrode. Depending on the requirements, different combination of the scanning mode and modulation can be used. In the case of raster scan, the light may be modulated periodically (for example sinusoidally) or may be not modulated. The unmodulated light will in reality behave like pulse modulation since each area element is illuminated only for a short time.

In the voltage mode, the probe operates with a high input impedance electronic detection system. In the current mode, the input impedance of the electronic system is lower than the output impendance of the semiconductor-reference electrode system. In the voltage mode, the time constant of the probe including input of the electronic detection system should be longer than the period (or effective pulse length) of light modulation but should be short enough to allow for charging of the semiconductor (formation of the depletion layer). The time constants between seconds and milliseconds should be adequate.

Referring now to FIG. 1, there is shown an enlarged cross-sectional view of an insulator IM on which a latent electrostatic image may be formed (by any known means, not shown) and, a readout device 11 and a reference electrode 12 according to one embodiment of the invention.

Readout device 11 includes a semiconductor plate 13 which is covered on its top or front surface 14 with a layer 15 of transparent protective insulating material. The protective insulating layer 15 serves as an electrical protection (blocking contact) against injection of charges from the semiconductor 13 into the body of insulating material IM whose electrostatic charge distribution is to be read out. Reference electrode 12 is disposed above and spaced apart from semiconductor 13. The body of insulating material IM on which the electrostatic charge to be measured is formed is disposed in the space between semiconductor 13 and the reference electrode 12. Reference electrode 12 comprises an optically transparent conductive layer 17 (or a conductor layer divided into sectors—e.g. stripes) on a transparent substrate 18. Alternatively, reference electrode 12 may comprise a conductive wire cloth. Semiconductor plate 13 is electrically connected to a lead 19 through an electrical contact 21, which is in the form of a layer, on the back side 20 of semiconductor plate 13. Another electrical lead 23 is connected to conductive layer 17 of reference electrode 12. Readout device 11 may be illuminated (scanned) from the front (top) through the reference electrode 12 as shown by arrow A.

In an embodiment of readout device 11 actually constructed and tested a crystalline silicon wafer was used as the semiconductor plate 13. Both n-type and p-type silicon were used and tested. N-type silicon wafers were single crystal Czochralski or (111) orientation and resistivity in the range of 5 to 7 ohms-cm. P-type silicon were also single crystals Czochralski or (111) orientation and resistivity in the range of 7 to 14 ohms-cm. A 100 to 300 nanometers silicon oxide overlayer was used as a protective insulator.

Instead of using single crystal silicon, other possible materials which may be used for the semiconductor 13 are, for example, microcrystalline silicon, amorphous (hydrogenated or not) silicon and silicon-germanium alloys. These materials, as will be explained layer, should be better for the construction of the readout device because the lifetime of minority carriers in these materials is shorter then in single crystals. The polycrystalline, microcrystalline and amorphous materials may also be produced in larger sizes than crystal wafers. The possible choices for the protective insulating layer 15 include silicon oxide ($SiO_2$) and silicon nitride ($Si_3N_4$) deposited or formed by chemical reaction (e.g./oxidation) and N-type or P-type amorphous silicon with silicon nitride.

The reference electrode 12 used in the constructed embodiment was a stainless steel wire cloth with number of meshes per linear inch in the range of $150 \times 150$ to $400 \times 400$ and with openings in the range of 0.1 to 0.04 mm respectively. Some tests were also performed using indium tin oxide (ITO) films deposited over the surface of glass facing the semiconductor 13. Reference electrode 13 was separated from the semiconductor 13 by a distance d of about 0.5 mm or less. This distance d, depending on the electronics and type of application, may be enlarged up to several millimeters.

The light sources used for illuminating the semiconductor in the constructed embodiments of the invention were light emitting diodes (LED) emitting light at the 585 and 700 nanometers (nm) and He-Ne (633 nm 15 nW) and diode (820 nm, 10 mW) lasers. Light from the He-Ne laser was modulated using an acousto-optic modulator. The LED and the diode laser were modulated with appropriate power supplies. Readout device 11 was illuminated from the top, as shown by arrow A.

Contact 21 may be in the form of a spot rather than a layer and may be on the side of semiconductor 13 rather than the back of semiconductor 13.

Semiconductor 13 may also be illuminated from the back (i.e. bottom) as shown by arrow B. This latter configuration, however, requires that the substrate on which the semiconductor is formed (if semiconductor 13 is only a layer) be optically transparent and that the electrical contact 21 to the semiconductor does not block the light so that the light can strike the bottom surface of semiconductor 13. The wavelength of the exciting light must be matched to the band gap of the semiconductor 13 in such a way that generation of carriers in the semiconductor 13 happens close enough to the front (i.e. top), active surface of the semiconductor 13.

For some applications (e.g. with a photoconductive insulator) it should be assured that light does not pass through semiconductor 13, or, if it actually does pass through, that it does not redistribute the charge in the insulator.

Figure 2:
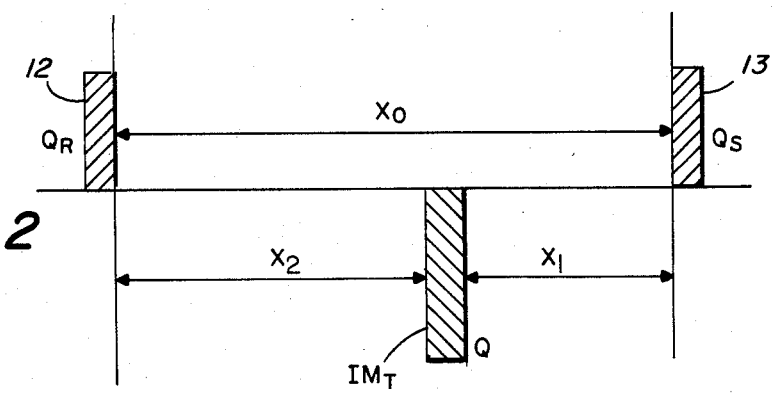
FIG. 2 shows the charge distribution between the semiconductor part of the readout device and the reference electrode in FIG. 1 by a negatively charged arbitrarily located thin insulator.

FIG. 2 shows the distribution between semiconductor 13 and reference electrode 12 of the charge induced by a negative charge accumulated in a thin layer insulator $IM_T$ which is placed between semiconductor 13 and reference electrode 12. To establish this distribution both semiconductor 13 and reference electrode 12 are the first connected to ground. This distribution follows from the theory developed for the metal-oxide-semiconductor (MOS) capacitors, and in particular an article "Ion Transport Phenomena in Insulating Films" by E. H. Snow, A. S. Grove, B. E. Deal, and C. T. Sah in Journal of Applied Physics, Volume 36, Number 5, pp. 1664–1673, 1965. From their considerations it follows that negative charge Q in insulating layer IM of negligible thickness will induce in semiconductor 13 a positive charge of the magnitude $$Q_S = -(x_2/x_0)Q,$$

and in the reference electrode 12 a positive charge of the magnitude:

$$Q_R = -(x_1/x_0)Q,$$

where $x_0$ is the distance between semiconductor 13 and reference electrode 12, $x_1$ is the distance between the insulator $IM_T$ and semiconductor 13 and $x_2$ is the distance between insulator $IM_T$ and the reference electrode 12. If the charge accumulated in insulator $IM_T$ is positive, then the charges induced in semiconductor 13 and reference electrode 12 will be negative.

The present invention involves the determination of the charge accumulated in the insulating layer IM by measuring charge induced in semiconductor 13. Therefore, as follows from the above equations, the charge to be determined should be located close to semiconductor 13 and far from reference electrode 12 or at least all distances should be precisely known. Some of the possible configurations of insulator IM are shown in FIGS. 3a, 3b and 3c.

Figure 3A:
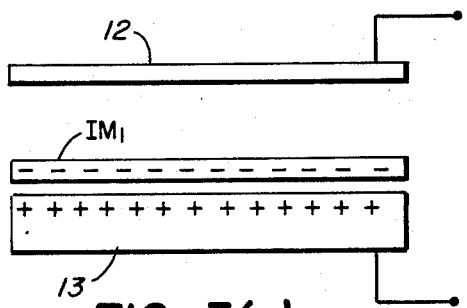
FIGS. 3(a), 3(b) and 3(c) are cross sectional views of the reference electrode and readout device combination shown in FIG. 1 with different insulator configurations.
Figure 3B:
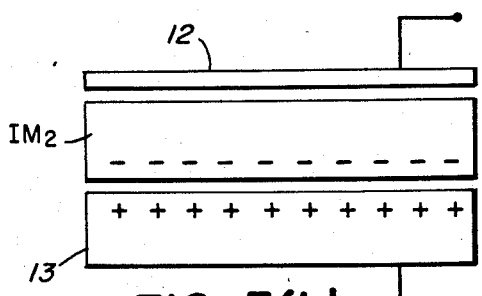
Figure 3C:
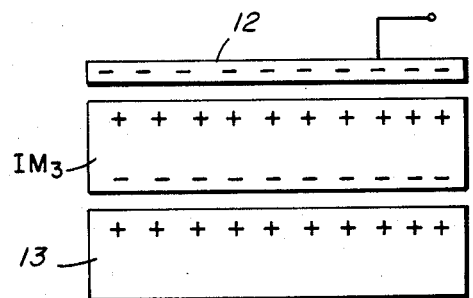

All charge distributions shown in FIGS. 3a–3c are established after grounding semiconductor 14 and reference electrode 12. This allows for outflow of the opposite sign charges from these electrodes.

In FIG. 3(a) an insulator IM, in the form of a thin insulating film is located relatively close to the semiconductor 13 (which may include a protective insulating layer, not shown) and relatively far from reference electrode 12. In this configuration, most of the charge is induced in semiconductor 13. If the distance between semiconductor 13 and reference measurement electrode 12 is, for example, 1 mm., and insulator $IM_1$ is at a distance of 0.001 mm from semiconductor 13, than only 0.001 of the total induced charge will be induced in reference electrode 12. This configuration may be realized by forming insulator $IM_1$, as a film on the semiconductor 13. Another example of such a configuration may be realized by measuring the charge deposited directly on insulating layer $IM_1$.

FIG. 3(b) illustrated an arrangement wherein the insulator $IM_2$ is a relatively thick plate with only one surface charged. In this configuration the charged surface of insulating plate $IM_2$ is located close to semiconductor 13 and the distance of reference electrode 12 from the opposite (uncharged) surface of insulator $IM_2$ is not critical. Effective operation of the readout device in this configuration is similar to that shown in FIG. 3(a) with the exception that charge is accumulated not in the thin film but in the thin layer of the thick insulating plate $IM_2$. The conditions for the location of this layer are the same as those discussed in the FIG. 3a. If insulator $IM_2$ is a photoconductor insulator, then this situation may be realized by illumination (or irradiation with X-rays or gamma rays) and separation of charges by a high electric field. Subsequently, the charge at one of the surfaces may be removed. Materials for which this configuration might be of interest are photoconductive insulators such as selenium or selenium alloys which are used in xerography and xeroradiography.

FIG. 3(c) shows the arrangement with an insulator $IM_3$ in the form of a relatively thick insulating plate with both surfaces charged. In this configuration, both semiconductor 13 and reference electrode 12 are located close to the opposite sides of insulating plate $IM_3$ in such a way that the distance between semiconductor 13 and reference electrode 12 is much larger than the distances from the respective surfaces of the insulating plate $IM_3$. In this configuration, most of the charge in semiconductor 13 is induced by the charge accumulated at the surface of insulator $IM_3$ located close to it, and the charge accumulated at the opposite surface of insulating place $IM_3$ (or thick layer) is neutralized by the charge induced in the reference electrode 12. Since the method of this invention uses the semiconductor to determine the charge, only the charge located at the surface of the insulator close to the semiconductor 13 will be measured. Therefore the method of this invention enables measuring of charges accumulating at the surface closer to the semiconductor and disregarding charges at the opposite surface.

The separation of the charges shown in FIG. 3(c) occures for example, in the photoconductive insulators used in xerography and xeroradiography.

The subject of the surface photovoltage has an extensive theoretical and experimental literature. In the method of this invention, the ac surface photovoltage (which may be defined as changes in voltage or current induced by light modulation of the surface potential barrier) permits the determination of the charge accumulated in the depletion layer formed at the semiconductor surface. The depletion layer and its associated surface potential barrier are formed to neutralize charge present in the insulating layer adjacent to the surface or at the insulator-semiconductor interface. Amplitude of modulation of the surface potential barrier height, induced by an intensity modulated light of photon energy exceeding the band-gap of a semiconductor is a function of the charge density in the depletion region. Therefore, measurement of ac surface photovoltage in accordance with the method of this invention permits the determination of the charge accumulated in the insulating layer adjacent the semiconductor surface or at the semiconductor-insulator interface.

In the following theoretical analysis, two different arrangements will be considered. First, the determination of the average charge over the entire insulator using uniform illumination of the semiconductor surface, and second mapping the charge distribution using a scanning laser beam focused on the surface of the semiconductor.

The semiconductor used in the method of this invention can be either n- or p-type. To focus attention, an n-type semiconductor will herein be considered. In the bulk of the semiconductor the positive charge of ionized donors is neutralized by the free electrons in the conduction band. The insulating layer adjacent to the semiconductor is negatively charged. The presence of this charge leads to the formation of a positively charged region (space charge-depletion range) depleted of electrons. The presence of uncompensated charge in the semiconductor leads to a change in the electrostatic potential and formation of an electrostatic potential barrier at the surface. In signal crystal silicon the height of this potential barrier may exceed 0.5 volts. In n-type silicon at a concentration of donor impurities equal to $10^{15}$ per $cm^3$, the width of the space charge region corresponding to 0.5 volts barrier height will be 0.8 $\mu m$ and the density of charge in this region will be $8*10^{10}$ $q/cm^2$.

The principle of the surface photovoltage measurements; in n-type semiconductor under depletion conductions will now be discussed.

Upon illumination with light of photon energy exceeding the band-gap of the semiconductor, the electron-hole pairs are generated in the space charge-depletion region. Because of the presence of the electric field in the space charge region, the photogenerated electrons flow towards the bulk of the semiconductor, and holes flow towards the surface. The total (net) charge in the semiconductor is not altered by this process, but the additional electric field associated with separation of the photogenerated electron-hole pairs decreases the electric field in the space charge region and lowers the surface potential barrier. This change is called surface photovoltage (as hereinbefore described).

The effect of photogeneration of carriers is suppressed by their recombination. Because of higher density of defects at the surface (when not passivated) than in the bulk, recombination of photogenerated carriers occurs principally at the surface. The recombination rate is limited by a probability that electrons will overcome the barrier (due to thermal excitation) and will reach the surface. Therefore, usually the lower the barrier, the higher the recombination rate. At constant intensity and small penetration depth of the incident light (when illuminated from the front; i.e. as shown by arrow A in FIG. 1) the generation rate of holes at the surface is independent of barrier height. Therefore, the relation between the surface photovoltage and the height of surface potential barrier is only controlled by the recombination rate. The lower the potential barrier, the lower the surface photovoltage. Therefore, the surface photovoltage can be used to measure the height of the surface potential barrier. Furthermore, since the height of the surface potential barrier, $V_s$, and the density of charge, $Q_{sc}$, in the space charge region are related, $Q_{sc} \alpha |V_s|^{\frac{1}{2}}$ (see S. M. Sze, "Physics of Semiconductor Devices", Wiley & Sons, New York 1969), the surface photovoltage can be used to measure the density of charge in the space charge region.

It has been previously determined that ac surface photovoltage $8V_s$ induced in a semiconductor by low intensity modulated light is proportional to the reciprocal of the semiconductor depletion layer capacitance $C_{sc}$. See, E. Kamieniecki "Determination of Surface Space Charge Capacitance Using Light Probe", Journal of Vacuum Science & Technology, Vol. 20, No. 3, pp. 811-814, 1982; and "Surface Measured Capacitance: Application to Semiconductor/Electrolyte System", Journal of Applied Physics, Vol. 44, No. 11, pp. 6481-6487, 1983. Since depletion layer capacitance is reciprocally proportional to the density of the charge in the depletion layer, this leads to the equation that ac surface photovoltage is proportional to the density of the charge in the depletion layer.

$$\delta V_s = A^* Q_{sc}, \tag{1}$$

where the factor A is proportional to the incident photon flux divided by the frequency of light modulation, and depends on other parameters of the system such as wavelength of the incident light and doping concentration of the semiconductor. Similarly it can be shown that for high intensities of the incident light, the ac surface photovoltage is given by the relation $$\delta V_s \alpha \ln(1 + B^* Q_{sc}) \tag{2}$$

where B is the proportionality factor similar to A in equation (1).

Figure 4:
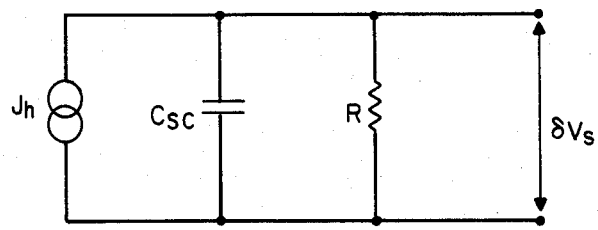
FIG. 4 is an equivalent electrical circuit useful in understanding the invention.

The equivalent circuit for the surface depletion layer when the ac surface photovoltage is measured is shown in FIG. 4.

The equivalent circuit of the surface depletion layer when a low signal ac surface photovoltage is measured with high input impendance eoectronic detection system (source follower) is discussed in an article by E. Kamieniecki "Surface Measured Capacitance: Application to Semiconductor/Electrolyte System", Journal of Applied Physics, Vol. 54, No. 11, pp. 6481-6487, 1983.

As discussed before, the space charge region in an n-type semiconductor in darkness is depleted of free electrons, i.e., is insulating. The photogenerated charge accumulates at two edges of this region, holes at the surface and electrons at the opposite edge of this region. At low intensities of illumination or, more exactly, at low charge injected during a single illumination cycle (pulse), the change of the width of this region, w, is negligible. Under such conditions, the space charge region can be represented by the space charge capacitance per unit area $C^*_{sc} = \epsilon_s/w$, where $\epsilon_s$ is the dielectric permittivity of the semiconductor. The total capacitance of the depletion layer is $C_{sc} = S^* C^*_{sc}$, where S is the area of the charge sensing element smallest of the areas of the semiconductor or the reference electrode). The photogeneration of carriers provides the current $J_h$ charging this capacitance. The recombination of carriers lowers the rate of charging of the space charge capacitance and can be represented by a resistor, R, connected in parallel. With the above notation, the relation describing the ac component of the surface photovoltage. $\delta V_s$, measured with a high input impedance electronic detection system (no load, no input current) for sinusoidally modulated illumination can be written in the form:

$$\delta V_s = C_{sc}^{-1} \frac{\tau}{1 + j\omega\tau} J_h, \tag{3}$$

where $\tau = RC_{sc}$, $\omega = 1\pi f$, and $j = \sqrt{-1}$.

For high frequencies of light modulation i.e. $\omega\tau >> 1$, this relation simplifies to $\delta V_s = -jJn/wC_{sc}$. The validity of these relations at higher frequencies (about 100 kHz) have been confirmed experimentally for several materials including single crystal silicon and galium arsenide.

The equivalent circuit of the basic ac surface photovoltage system with arbitrary input impedance of the electronic detection system is discussed in an article by E. Kamieniecki "Surface Measured Capacitance: Application to Semiconductor/Electrolyte System", Journal of Applied Physics, Vol. 54, No. 11, pp. 6481-6487, 1983.

Figure 5:
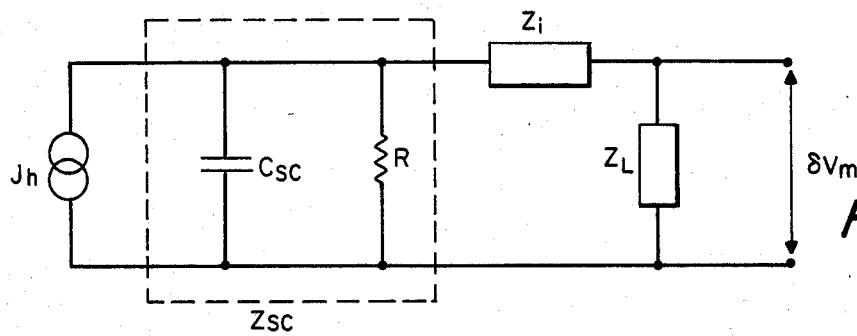
FIG. 5 is an equivalent electrical circuit useful in understanding the invention.

In FIG. 5 $Z_{sc}$ is the impedance of the space charge region, $Z_i$ is the coupling impedance between the semiconductor and the reference electrode, and $Z_L$ is the input impedance of the electronic detection system. The current across the load is given by the equation:

$$J_L = J_h \left( 1 + \frac{Z_i + Z_L}{Z_{sc}} \right)^{-1}. \tag{4}$$

At infinite coupling impedance (case of FIG. 5), Zg, the open circuit photovoltage is $$\delta V_s = J_h Z_{sc}. \tag{5}$$

Therefore, the ac voltage across the load impedance $Z_L$ is given by $$\delta V_m = \delta V_s \left( 1 + \frac{Z_i + Z_{sc}}{Z_L} \right)^{-1}. \tag{6}$$

For frequencies high enough so that capacitive components of the impedances are much lower than resistive components, the above equation simplifies to $$\delta V_m = \delta V_s \left( 1 + \frac{C_L}{C_T} \right)^{-1}, \tag{7}$$

where $$C_T = \left( \frac{1}{C_i} + \frac{1}{C_{sc}} \right)^{-1},$$

and $C_L$ is the load capacitance, $C_i$ and $C_{sc}$ are the coupling and space charge capacitances, respectively. The experimental confirmation of the dependence (7) is shown in the next figure.

Figure 6:
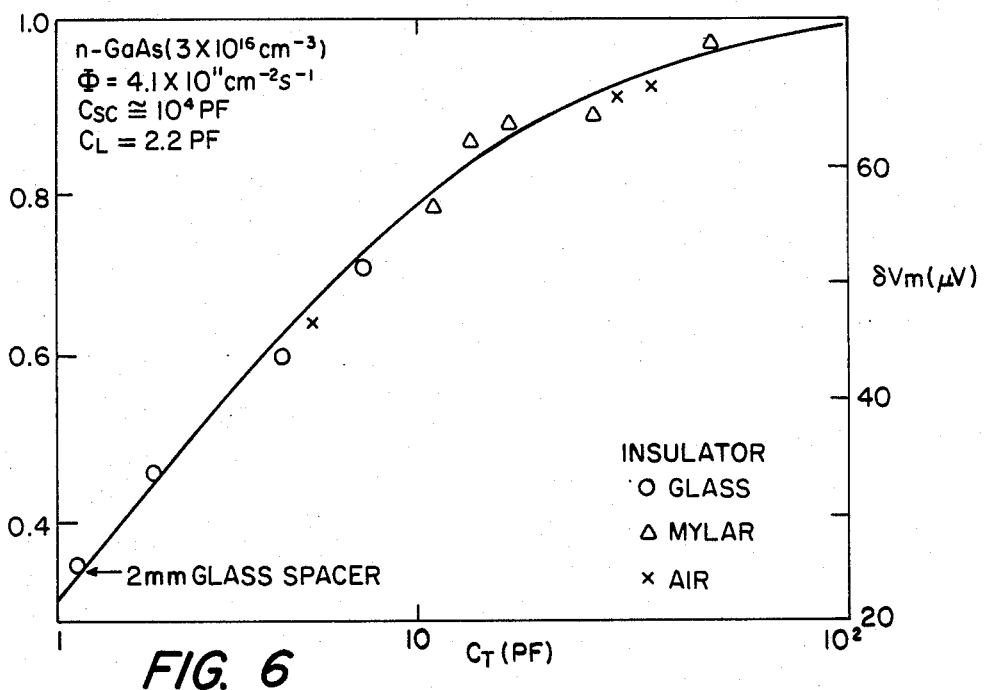
FIG. 6 is a graph useful in understanding the invention.

The dependence of the measured ac surface photovoltage signal on the total capacitance of n-GaAs in the configuration of FIG. 1 for different spacing between the semiconductor and the reference electrode achieved using different thickness insulating materials is shown in FIG. 6. The solid line was calculated from equation (7) as per the article by E. Kamieniecki "Surface Measured Capacitance: Application to Semiconductor/Electrolyte System", Journal of Applied Physics, Vol. 54, No. 11, pp 6481–6487, 1983.

In a practical system $C_i << C_{sc}$. If a high input impedance electronic detection system is used with $C_L << C_i$, it follows from the above relationships and from results of FIG. 6 that the measured photovoltage is weakly dependent on $C_i$ and therefore on the distance between the semiconductor surface and the reference electrode.

Another alternative to voltage measurements is current measurement with a low input impedance electronic detection system for which $Z_L << Z_i$. At high enough frequencies such that capacitive components of the impedances are much lower than resistive components, equation (4) simplifies to $$J_L = J_h \left(1 + \frac{C_{sc}}{C_i}\right)^{-1} \quad (8)$$

In a practical system in which the coupling capacitance is much lower than space charge capacitance.

$$J_L = J_h \frac{C_i}{C_{sc}}. \quad (9)$$

For silicon with a doping concentration of $10^{15}$ cm$^{-3}$, the space charge capacitance per unit area $C_{sc}^* \approx 10^{-8}$ F/cm$^2$, and for a gap between semiconductor and the reference electrode 1 mm, the coupling capacitance per unit area $C_i^* \approx 10^{-11}$ F/cm$^2$, $$J_L \approx 10^{-3} J_h, \quad (10)$$

$J_h$ is related to the incident light intensity by equation $$J_h = q\Phi S \quad (11)$$

From the relationships (10) and (11) the current measured for uniformily illuminated semiconductor $$J_L \approx 5 \text{ nA at } \Phi S = 10 \text{ }\mu W, \text{ and}$$

$$J_L \approx 5 \text{ }\mu A \text{ at } \Phi S = 10 \text{ } mW.$$

All of the above considerations apply to uniform illumination from the front of the entire surface of the semiconductor located under the reference electrode.

If the semiconductor is illuminated with a small light spot, the generated carriers will not be confined to the spot area only. Because of diffusion, the photogenerated carriers accumulated at the surface (holes in n-type semiconductor) will spread to an area defined by the diffusion length of the carriers at the surface (parallel to the surface plane). Following the teachings in the article by D. G. Avery and J. B. Hunn entitled "The Use Of A Modulated Light Spot In Semiconductor Measurements", Proceeding of the Physical Society (London), Vol. B68, pp. 918–921, 1955, the effective diffusion length in the case of an intensity modulated light spot is given by the relation:

$$L^2_h = (D_h\tau)/(1+J\omega\tau) \quad (12)$$

where $D_h$ is the diffusion coefficient of holes and $\tau$ is the surface recombination time. Neglecting reduction of carrier mobility at the surface, the diffusion coefficient of holes in single crystal n-Si is $D_h \approx 10$ cm2/s. With $\tau$ on the order of $10^{-5}$ seconds the diffusion length of holes observed in silicon when nonmodulated light is used ($\omega=0$) is of the order of 100 $\mu$m.

The use of intensity modulated light results in an increase in the resolution of measurements. An increase in resolution of measurements can be also achieved by a reduction in $\tau$.

Thus, the resolution obtainable is dependent on the frequency of modulation of the illuminating of the illuminating light beam. A resolution of better than 0.1 mm has been achieved using a semiconductor that is crystalline or amorphous silicon and which is illuminated with a light beam that is intensity modulated at a frequency of 80 kHz.

In the case of back illumination, the considerations are similar but with three additions or differences. Firstly, the carriers which go into the depletion layer are supplied from the bulk of the semiconductor where they are generated due to illumination. Secondly, the photovoltage generated is leff effective than in the case of front illumination since some of the carriers recombine before reaching the depletion layers. Thirdly, in order to obtain high resolution the thickness of the semiconductor layer should be smaller than in the case of front illumination.

Figure 7:
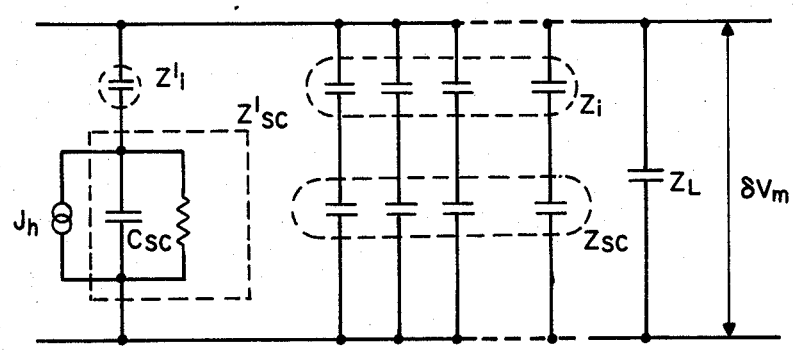
FIG. 7 is an equivalent circuit useful in understanding the invention.

The equivalent circuit of the basic ac surface photovoltage system with arbitrary input impedance of the electronic detection system for local illumination of the semiconductor surface with a focused light spot is shown in FIG. 7.

In the case of local generation of carriers (due to illumination with a focused spot) in the area smaller than the surface of semiconductor under reference electrode, $Z_{sc}$ and $Z_i$ of FIG. 5 become associated with an area limited by the size of the spot and surface diffusion of photogenerated holes ($Z_{sc}^l$ and $Z_i^l$ in FIG. 7). The dark portion of the charge sensing element lowers the input impendence of the electronic detection system. Therefore, $Z_i + Z_{sc}$ in equation (6) will be replaced by $Z_i^e + Z_{sc}^l$ (impedance of the spot region). In voltage measurements, the input impedance of the electronic detection system is high; therefore, $Z_L$ in equation (6) can be replaced by the total impedance of the dark portion of the receptor. If s is the area of the illuminated portion (plus diffusion) and S is the total area of the receptor (much larger than s), then the load impedance will represent only a fraction(s/S) of the impedance of the illuminated area, assuming that the change in the total impedance of the illuminated area due to illumination is negligible (e.g. due to $Z_i^l >> Z_{sc}^l$). The output voltage will be reduced by the same factor. Hence, $$\delta V_m = (s/S)\delta V_s. \quad (13)$$

The factor s/S reduces the sensitivity of detection.

In the current measurement mode, the load impedance of the electronic detection system can be made equal to the impedance of the unilluminated portion of the charge sensing element, and therefore much lower than $Z_i^l$ in FIG. 7. Under such conditions the current sensed by electronic detection system will be only reduced by factor of two as compared to the uniform illumination [equation (10)] if the total illumination of the semiconductor is kept the same. However, also in the current mode, the performance of the system is expected to be reduced as the ratio of the spot area to the total area of the semiconductor decreases.

The performance of the readout apparatus and in particular, the sensitivity in the voltage measuring mode can be improved by dividing the reference electrode into sectors.

Figure 8A:
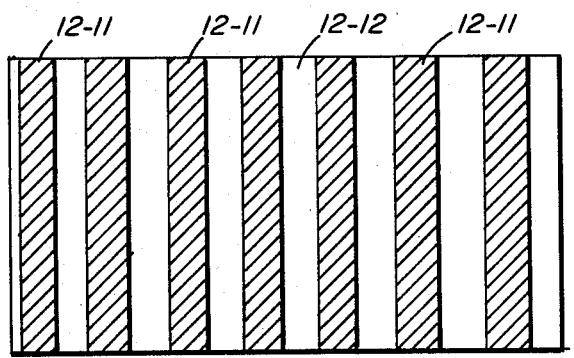
FIGS. 8(a) and 8(b) are top views partly broken away of alternate configurations of the reference electrode in the apparatus of the invention.
Figure 8B:
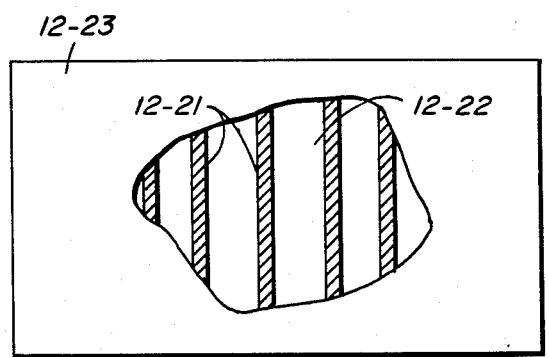

In FIGS. 8(a) and 8(b), there are illustrated some alternate possible configurations of reference electrode 12.

In FIG. 8(a) reference electrode 12-1 comprises a plurality of conductive stripes 12-11 on the top surface of a transparent substrate 12-12. The width of the stripes 12-11 is about the same as the diameter of the light beam spot (plus diffussion) where it strikes reference electrode 12-1. In this case, S corresponds to the area of one stripe (sector) only and therefore the factor s/S increases.

In FIG. 8(b), the reference electrode 12-2 comprises a plurality of conductive stripes 12-21, having a width much thinner than the diameter of the light beam spot, sandwiched between a transparent substrate 12-22 and a uniform layer of photoconductive insulating material 12-23. This insulating layer 12-23 becomes conductive in the illuminated area making electrical contact to the respective stripe. In this case, if the area of the connecting stripes can be neglected the factor s/S becomes close to unity. If amorphous doped silicon is used as an active semiconductor electrode, the insulating layer 12-23 could be of undoped, high resistivity amorphous silicon.

Figure 9:
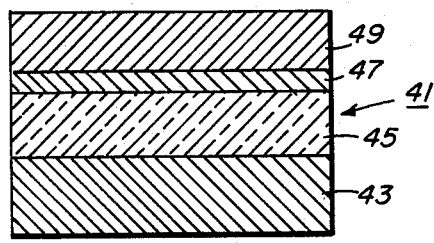
FIG. 9 is a cross sectional view of one embodiment of photoreceptor constructed according to this invention.

Referring now to FIG. 9 there is shown a cross-section view of an embodiment of a photoreceptor 41 constructed according to the teachings of the present invention, the photoreceptor comprising as a single unit a readout device and photoconductive insulator.

Photoreceptor 41 includes a substrate 43 made of conductive material. A layer of semiconductive material 45, which may be for example a single crystal (e.g. silicon), or an amorphous layer (e.g. Si or Si-Ge alloy) is deposited by any conventional means on the top surface of substrate 43. A protective insulating layer 47 which may be for example, silicon oxide or silicon nitride is deposited over layer 45 and a photoconductive insulating layer 49, such as, for example, selenium-alloy is formed over layer 47. Examples of other photoconductive insulating layers which may be used are amorphous or polycrystalline mercuric iodide and lead halides, such as PbI2.

In using photoreceptor 41, a previously charged (e.g. using a corona) photoconductive insulating layer 49 is exposed to a pattern of radiation, such as X-ray radiation which forms thereon a latent charge image. The surface depletion layer induced on semiconductor layer 45 by the latent charge image is read out by scanning the semiconductor 45 with a beam of light and measuring the output photovoltage developed across semiconductor 45 and a reference electrode (not shown). Semiconductor 11 may be scanned either from the top or the bottom. If scanned from the top the scanning light should be of a wavelength that does not interact with photoconductive insulating layer 49. If scanned from the bottom, the substrate 43 must be transparent.

Figure 10:
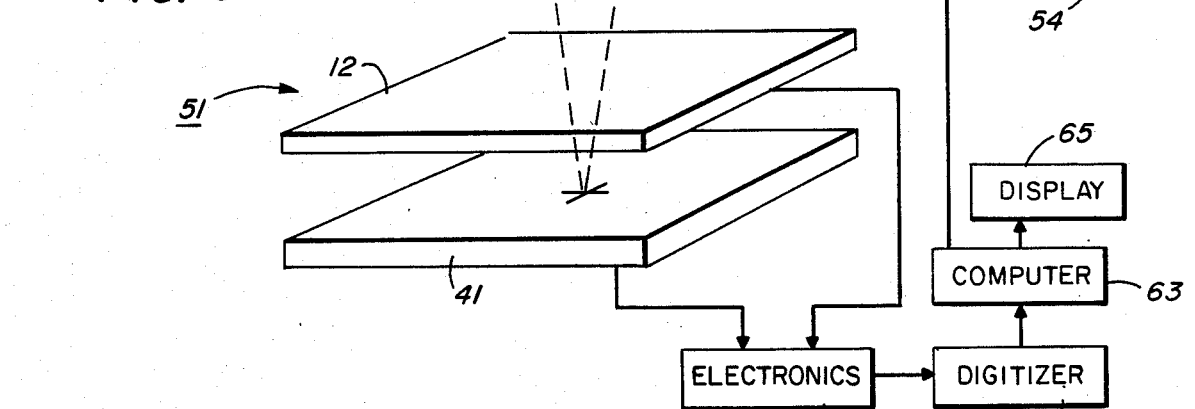
FIG. 10 is a schematic of an embodiment of an apparatus for practicing the invention.

Referring now to FIG. 10 there is illustrated an embodiment of an apparatus 51 for practicing the invention.

An intensity modulated beam of light produced by a diode laser light source 53 which is powered by a modulated power supply 54 is focused by a lens 55 through conductive electrode 12 onto the semiconductor layer in photoreceptor 41. Examples of some but not all of the other light sources that may be used are a light emitting diode (LED) a helium-neon (He-Ne) laser or a helium-cadmium (He-Cad) laser. If an LED is employed, modulation of the light beam is achieved by using a modulated power supply. If a gas laser is used, modulation of the light beam is achieved using an external light modulator, such as an acousto-optical modulator. Before reaching the semiconductor layer, the intensity modulated light beam is deflected by an x-y scanner 57, which may be an xy optical galvanometer Scanner Model No. XY100PD, manufactured by General Scanning Inc. Watertown, MA. The resulting output photovoltage signal developed across conductive electrode 12 and photoreceptor 41 is amplified by an amplifier in electronics 59, digitized by a digitizer 61 and then fed into a computer 63 where it may be processed, stored and/or displayed on a monitor 65.

Figure 11:
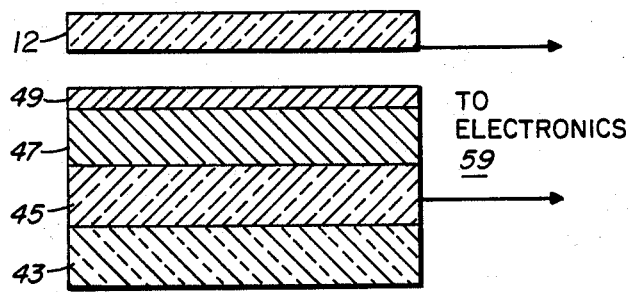
FIG. 11 is a cross-section view of a portion of another embodiment of an apparatus for practicing the invention.
Figure 11:
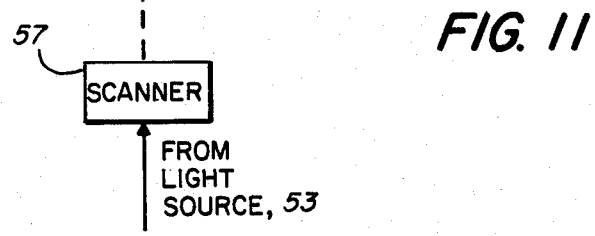

In FIG. 11 there is shown an arrangement wherein the semiconductor 45 is illuminated from the back rather than from the front.

Figure 12:
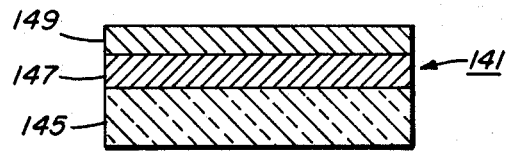
FIG. 12 is a cross-sectional view of another embodiment of a photoreceptor constructed according to this invention.

In FIG. 12 there is shown another embodiment of a photoreceptor according to this invention, the photoreceptor being identified by reference numeral 141. Photoreceptor 141 includes a semiconductor wafer 145 (which may be silicon) on which is deposited on its top surface a protective insulating layer 147 (which may be silicon oxide) and a photoconductive insulating layer 149 (which may be selenium).

Figure 13:
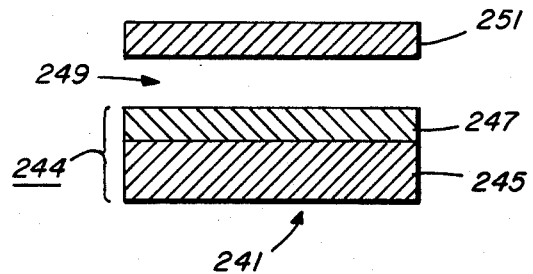
FIG. 13 is a cross-sectional view of another embodiment of a photoreceptor constructed according to this invention.

In FIG. 13, there is shown another embodiment of a photoreceptor according to this invention, the photoreceptor being sensitive to X-rays or any other ionizing radiation and being identified by reference numeral 241. Photoreceptor 241 includes a readout device 244 comprising a semiconductor wafer 245 (which may be silicon) on which is deposited a protective insulating layer 247 (which may be silicon oxide). Readout device 244 is separated by a space containing a gas (such as air or freon or xenon) from a metal electrode 251 (which may be aluminum lead or tungsten). In using photoreceptor 241, a high voltage is first applied between electrode 251 and semiconductor 245. When the photoreceptor is then irradiated, such as with X-ray radiation, the photons or radiation induced photoelectrons form ions in the gas which are deposited on the surface of protective insulator 247 by the electric field.

It is to be noted that in all embodiments of the invention wherein the insulator (IM or 49) is photoconductive it is essential that the readout beam of light not disturb the distribution of charge in the photoconductive insulator. This applies regardless of whether the semiconductor is illuminated from the front or from the back. This may be realized by proper choice of operative wavelengths of the illuminating light beam and of the particular materials used for the photoconductive insulating and semiconductive layers.

The embodiment of the present invention is intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A method of reading out accumulated charges on an insulator without destroying the accumulated charges, the method comprising:
   a. providing a semiconductor which is conductive in the dark,
   b. positioning the insulator relative to the semiconductor such that the accumulated charges on the insulator are in close proximity to but not in contact with the semiconductor, the accumulated charges on the insulator inducing a depletion layer in the semiconductor, the accumulated charges in the depletion layer in the semiconductor being related to the accumulated charges on the insulator, and
   c. detecting the magnitude and location of the accumulated charges in the depletion layer in the semiconductor.

2. The method of claim 1 and wherein detecting the magnitude and location of the accumulated charges in the depletion layer in the semiconductor comprises using the ac surface photovoltage effect.

3. The method of claim 2 and wherein using the ac surface photovoltage effect comprises providing a reference electrode, illuminating the semiconductor with a beam of light and measuring the photovoltage signal across the reference electrode and the semiconductor.

4. The method of claim 3 and wherein the beam of light is intensity modulated.

5. The method of claim 4 and wherein the beam of light is scanning over the semiconductor.

6. The method of claim 27 and wherein the reference electrode is positioned such that the insulator is between the reference electrode and the semiconductor.

7. The method of claim 6 and wherein the reference electrode is transparent to the beam of light.

8. The method of claim 7 and further providing a protective insulating layer between the semiconductor and the insulator for preventing the flow of charges between the insulator and the semiconductor.

9. The method of claim 8 and wherein the semiconductor is scanned through the reference electrode.

10. The method of claim 9 and wherein the semiconductor has a top and a bottom, the depletion layer induced in the semiconductor is near the top and the semiconductor is scanned through the bottom.

11. The method of claim 10 and wherein said insulator is photoconductive.

12. The method of claim 11 and further including digitizing the photovoltage signals so generated.

13. The method of claim 12 and wherein the accumulated charges are formed on the insulator by the radiation.

14. The method of claim 13 and wherein the scanning beam of light is of photon energy that will interact with the semiconductor.

15. The method of claim 1 and wherein the semiconductor is a wafer.

16. The method of claim 1 and wherein the semiconductor and the insulator are both films on a substrate.

17. The method of claim 1 and wherein the semiconductor is a wafer and the insulator is a film on the wafer.

18. Apparatus for use in reading out accumulated charges on an insulator without destroying the accumulated charges, the apparatus comprising:
   a. a semiconductor, said semiconductor being conductive in the dark and being disposed in relatively close proximity to but not in contact with the accumulated charges on the insulator such that a depletion layer related to the accumulated charges on the insulator is induced in the semiconductor,
   b. a reference electrode, and
   c. means for scanning said semiconductor with a beam of light, the beam of light producing an electrical signal between the semiconductor and the reference electrode corresponding to charges induced in the semiconductor.

19. The apparatus of claim 18 and wherein the semiconductor is in the form of a plate.

20. The apparatus of claim 19 and wherein the plate is a wafer.

21. The apparatus of claim 18 and wherein the semiconductor is in the form of a film.

22. The apparatus of claim 18 and wherein the semiconductor and the insulator are both films on a substrate.

23. The apparatus of claim 18 and wherein the semiconductor is a plate and the insulator is a film on said plate.

24. The apparatus of claim 18 and wherein the semiconductor is selected from the group consisting of microcrystalline silicon, polycrystalline silicon, amorphous silicon, alloys of silicon and alloys of silicon-germanium.

25. The apparatus of claim 18 and further including a protective insulating layer on the semiconductor.

26. The apparatus of claim 25 and wherein the beam of light is intensity modulated.

27. The apparatus of claim 26 and further including an electrical contact on the semiconductor.

28. The apparatus of claim 18 and wherein the reference electrode comprises:
   a. a transparent nonconductive substrate, and
   b. a plurality of parallel stripes of conductive material on said substrate.

29. The apparatus of claim 18 and wherein the reference electrode comprises:
   a. a substrate of transparent nonconductive material,
   b. a uniform layer of photoconductive insulating material on top of the substrate, and
   c. a plurality of parallel stripes of conductive material sandwiched between the substrate and the layer of photoconductive insulating material.

30. Apparatus for use in reading out accumulated charges on an insulator, the apparatus comprising:
   a. a semiconductor which is conductive in the dark, said semiconductor being disposed on one side of the insulator in relatively close proximity but not in contact with the accumulated charges on the insulator such that a depletion layer is induced thereon related to the accumulated changes on the insulator;
   b. a reference electrode on the other side of the insulator,
   c. means for scanning the semiconductor with a beam of light, the beam of light producing an electrical signal between the semiconductor and the reference electrode corresponding to charges induced on the semiconductor, and
   d. means for detecting the electrical signal.

31. A method of reading out accumulated charges on an insulator without destroying said accumulated charges, the method comprising:
   a. providing a semiconductor which is conductive in the dark,
   b. forming a depletion layer in the semiconductor, c. positioning the semiconductor in close proximity to, but not in contact with the insulator so that accumulated charges on the insulator cause a change in the depletion layer in the semiconductor, said change in the depletion layer in the semiconductor being related to the accumulated charges on the insulator, and d. detecting the magnitude and location of the changes in the depletion layer in the semiconductor.

32. The method of claim 31 and wherein detecting the magnitude and location of the changes in the depletion layer in the semiconductor comprises using the ac surface photovoltage effect.

33. The method of claim 32 and wherein using the ac surface photovoltage effect comprises providing a reference electrode, illuminating the semiconductor with a beam of light and measuring electrical signals generated between the reference electrode and the semiconductor.

34. A method of reading out accumulated charges in a first layer of insulating material, said first layer of insulating material being on top of a second layer of insulating material, said second layer of insulating material being on top of a layer of semiconductor material, said layer of semiconductor material being conductive in the dark and being on the top surface of a substrate, said accumulated charges in said first layer of insulating material inducing a depletion layer in said layer of semiconductor material, said method comprising:

a. providing a reference electrode, and b. measuring the surface photovoltage between the layer of semiconductor material and the reference electrode.

35. A method of reading out accumulated charges on a sheet of insulating material without destroying the accumulated charges, the method comprising:

a. providing a sheet of semiconductor material which is conductive in the dark, b. positioning the sheet of insulating material relative to the sheet of semiconductor materials such that the accumulated charges on the sheet of insulating material are in close proximity to but not in contact with the sheet of semiconductor material, the accumulated charges on the sheet of insulating material including a depletion layer in the sheet of semiconductor material, the accumulated charges in the depletion layer in the sheet of semiconductor material being related to the accumulated charges in the sheet of insulating material, and c. detecting the magnitude and location of the accumulated charges in the sheet of semiconductor material.

36. The method of claim 35 and wherein detecting the magnitude and location of the accumulated charges in the sheet of semiconductor material comprises using the ac surface photovoltage effect.

37. A device for use in recording and reading out a charge distribution pattern comprising:

a. a substrate of conductive material, b. a layer of semiconductor material on top of the substrate, the layer of semiconductor material being conductive in the dark, c. a protective insulative layer on top of the layer of semiconductive material, and d. a photoconductive insulating layer on top of the protective insulating layer.

38. The device of claim 37 and wherein the reference electrode comprises a plurality of conductive stripes on a transparent substrate.

39. The device of claim 37 and wherein the reference electrode is a transparent conductive material.

40. A photoreceptor comprising:

a. a semiconductor, b. a protective insulator on the semiconductor, c. a photoconductive insulator on the protective insulator.

41. A photoreceptor comprising:

a. a wafer of semiconductor material, having a top surface and a bottom surface, b. a protective insulating layer on the top surface of the wafer, and c. a metal electrode above and spaced apart from the protective insulating layer.

42. The photoreceptor of claim 41 and wherein the wafer is a semiconductor having a single type of dopant.

* * * * *